United States Patent [19]

Kubena et al.

[11] Patent Number: 4,908,226
[45] Date of Patent: Mar. 13, 1990

[54] SELECTIVE AREA NUCLEATION AND GROWTH METHOD FOR METAL CHEMICAL VAPOR DEPOSITION USING FOCUSED ION BEAMS

[75] Inventors: Randall L. Kubena, Canoga Park, Calif.; Thomas M. Mayer, Chapel Hill, N.C.

[73] Assignee: Hughes Aircraft Company, Los Angeles, Calif.

[21] Appl. No.: 197,734

[22] Filed: May 23, 1988

[51] Int. Cl.$^4$ .............................. B05D 3/06
[52] U.S. Cl. .................... 427/38; 427/124; 427/250; 427/319; 427/320; 250/492.3; 361/380; 361/397; 361/401; 219/121.35
[58] Field of Search ............ 427/38, 124, 319, 320, 427/250; 219/121.35; 250/492.3, 492.2, 492.1; 361/380, 397, 401

[56] References Cited

U.S. PATENT DOCUMENTS 4,609,809 9/1986 Yamaguchi et al. ........... 219/121.35
4,766,516 8/1988 Ozdemir et al. .................... 361/380

FOREIGN PATENT DOCUMENTS 0153854 2/1985 European Pat. Off. ....... 250/492.21

OTHER PUBLICATIONS

Shedd et al., "Focused Ion Beam Induced Deposition of Gold" Appl. Phys. Lett. 49(23) Dec. 1986, pp. 1584–1586.
Ehrlich et al., "A Review of Laser-Microchemical Processing" J. Vac. Sci. Technol. B1, pp. 969–984 (1983).
Gamo et al., "Ion Beam Assited Deposition of Metal Organic Films Using Focused Ion Beams" Jpn. J. Appl. Phys. Vol. 23, May 1984, pp. 293–295.
Matsui et al., "Ion Species Dependence-of focused--Ion-Beam Lithography" J. Vac. Sci. Technol. B5(4) Jul./Aug. 1987 pp. 853–857.
Matsui et al., "Lithographic Approach for 100 nm Fabrication by Focused Ion Beam" J. Vac. Sci. Technol B4(4) Jul./Aug. 1986, pp. 845–849.
Kaito et al., "Mask Repair Using Focused Ion Beam" Seiko Instruments and Electronics 1985.9.

Primary Examiner—Norman Morgenstern
Assistant Examiner—Roy V. King
Attorney, Agent, or Firm—P. M. Coble; W. K. Denson-Low

[57] ABSTRACT

A method for depositing metallic lines on an IC chip or mask is described using a focused ion beam (FIB) with a much lower ion dosage than previously required, on the order of $10^{14} - 10^{15}$ ions/cm$^2$. A substrate is scanned with the FIB to produce a series of nucleation sites on the substrate surface. These nucleation sites can be in an adlayer or can be produced by lattice damage or sputtering directly in the substrate material. The substrate is then exposed to a source gas containing the material to be deposited, while heated to a temperature slightly less than the spontaneous thermal decomposition temperature of the source gas. This results in a well-defined line of materials being deposited from the source gas along the line defined by the nucleation sites. The ratio of the spontaneous activation energy to the autocatalytic activation energy for the gases is preferably at least about an order of magnitude, and the FIB is preferably moved in multiple scans across the desired line. In a particular embodiment both the adlayer and source gas comprise iron pentacarbonyl, an ion dosage of $3 \times 10^{14}$ ions/cm$^2$ is used, and the substrate is heated to approximately 130° C. The ion dosage is low enough that the system is compatible with other FIB processes, such as lithography, implantation and sputtering. Applications include the fabrication and repair of both ICs and masks.

44 Claims, 3 Drawing Sheets

SELECTIVE AREA NUCLEATION AND GROWTH METHOD FOR METAL CHEMICAL VAPOR DEPOSITION USING FOCUSED ION BEAMS

BACKGROUND OF THE INVENTION

1. Field of the Invention

This invention relates to methods for depositing metallic lines on a substrate such as an IC chip or mask, and more particularly to deposition methods employing a focused ion beam to initiate the deposition.

2. Description of the Related Art

Several methods have been employed for depositing lines of material on a substrate in connection with the manufacture or repair of IC chips and masks. These methods include the use of electron beams, laser beams and ion beams. However, none of these methods have been able to achieve a combination of rapid writing, relatively thick lines, resolution of less than a half micron, a high purity of the deposited material, and process compatibility with other focused ion beams (FIB) process techniques.

Prior e-beam approaches have employed both direct polymerization, and chemical vapor deposition (CVD) techniques. Direct polymerization is accomplished at room temperature, with the e-beam left on constantly at a dosage on the order of $10^{17}$–$10^{18}$ electrons/cm$^2$. The CVD approach is employed at a temperature slightly below the spontaneous thermal decomposition temperature of the gas from which the growth material is extracted. The e-beam is turned off after scanning a line on the substrate, and deposition takes place in the presence of a gas containing the material to be deposited. Although a somewhat lower e-beam dosage is required with the CVD approach, the dosage must still be on the order of $10^{16}$–$10^{17}$ electrons/cm$^2$ for reasonable selectivity, representing a dosage reduction of only about 1 order of magnitude. The above temperature and doses have been employed to deposit iron from iron pentacarbonyl gas, but a comparable difference between the direct polymerization and CVD approaches has also been experienced for other materials. Although metal lines with widths in the submicron range have been deposited with electron beams, they typically require high electron doses. The use of electron beams for the CVD of iron lines in the presence of iron pentacarbonyl gas is discussed in Kunz et al., "Catalytic Growth Rate Enhancement of Electron Beam Deposited Iron Films", *Appl. Phys. Lett.*, Vol. 50, No. 15, Apr. 13, 1987, pages 962–64.

Laser assisted deposition has also been employed at temperatures below the spontaneous thermal decomposition temperature of the source gas for the material being deposited. However, in the case of laser assisted deposition the laser spot cannot be focused to a diameter below about 0.5–1 micron. This precludes the use of laser assisted deposition for IC applications having submicron geometries. Laser assisted deposition is discussed in Higashi et al., "Summary Abstract: Nucleation Considerations in the Wavelength-Dependent Activation Selectivity of Aluminum Chemical-Vapor Deposition", *J. Vac. Sci. Technol.*, Vol. B5, No. 5, Sept./Oct. 1987, pages 1441–43.

Focused ion beams have previously been used to deposit metal lines at room temperature in a direct polymerization process. A FIB scans the substrate along the locus of the desired growth line, in the presence of a gas containing the material to be deposited. Unlike the CVD process that has been employed with e-beams and lasers, in which the beams are turned off once nucleation sites have been established and the majority of metal growth occurs by deposition thereafter, the FIB technique has required that the beam be left on during the entire growth period. The previous FIB processes also have several other significant drawbacks. Relatively high doses, on the order of $10^{17}$ ions/cm$^2$ or greater, have been required to deposit lines that were only a few thousand angstroms thick. The impurity level of the deposited lines is quite high, exceeding 25%, and thereby resulting in a higher resistance than desired. Care also must be taken to ensure that the deposited material is not sputtered away by excessive energy in the beam. The requirement of a relatively high ion dose significantly slows down the speed at which lines can be written, thereby making it difficult to integrate the writing of metal lines with other higher speed FIB processes used in the fabrication of ICs. Thus, although ion beams can easily be focused to below a micron in diameter and thus have the potential for submicron resolution in IC fabrication, a practical way to integrate rapid FIB metal line deposition into an IC fabrication process has not previously been found. The use of a FIB for metal deposition by direct polymerization is described in Shedd et al., "Focused Ion Beam Induced Deposition of Gold", *Appl. Phys. Lett.*, Vol. 49, No. 23, Dec. 8, 1986, pages 1584–86.

Other FIB processes used in IC fabrication are implantation (for selective doping), lithography (for defining small patterns), and sputtering (for removing material). Implantation is generally performed at a dosage within the range of $10^{12}$–$10^{15}$ ions/cm$^2$, lithography within the range of $10^{13}$–$10^{15}$ ions/cm$^2$, and sputtering at about $10^{16}$–$10^{17}$ ions/cm$^2$. A FIB metal deposition technique that required ion dosages comparable to these other processes would make possible the totally mask-free fabrication of ICs. Unfortunately, such a technique has not previously been available.

SUMMARY OF THE INVENTION

In view of the above limitations of the related art, the present invention seeks to provide a method of using a FIB to deposit lines of material of submicron width that have a high purity, are relatively thick, require a low ion dosage that is compatible with other FIB processing techniques, and can be rapidly deposited. It also seeks to use a FIB in connection with a CVD technique that allows the beam to be turned off during the majority of the growth period.

The present invention achieves these goals with a new FIB deposition technique that has been found to be compatible with CVD. A substrate upon which a line of material is to be deposited is scanned along the locus of the line with a FIB at a sufficient ion dosage and energy to form nucleation sites on the substrate along the locus. Scanning takes place with or without the presence of an adlayer gas.

The substrate is then exposed to a source gas which includes the material to be deposited, and is heated to a temperature high enough for the material to grow upon the nucleation sites and form a substantially continuous deposit, but below the source gas' spontaneous thermal decomposition temperature for the period of time the substrate is heated and exposed to the source gas. The FIB scanning is terminated after a brief initial period of time, while the substrate heating and exposure to the source gas is continued after the termination of scanning to complete the growth process. The source gas may be either the same as or different from any adlayer gas used.

Significant reductions in the ion dosage are achieved for gases in which the ratio of the spontaneous activation energy to the autocatalytic activation energy is at least about an order of magnitude. For iron pentacarbonyl, high purity iron lines have been deposited upon a silicon substrate with a FIB ion dosage on the order of $10^{14}$–$10^{15}$ ions/cm$^2$, and specifically $3 \times 10^{14}$/cm$^2$, with a substrate temperature of approximately 130° C. With this material the FIB scanning can be performed at a speed of 1 mm/sec, followed by an exposure of the heated substrate to the source gas for about 1 or 2 minutes. Better results are achieved with a series of rapid multiple scans, rather than a single longer scan. The significant dose reduction compared to e-beam CVD techniques using the same iron pentacarbonyl source gas is believed to be due to the fact that the beam of ions can create nucleation sites by both adlayer decomposition and direct substrate damage.

The new FIB assisted deposition method has numerous applications, including the in-situ formation of circuit connections during the fabrication of an IC chip, the repair of chip circuit connections, the formation of lines on a mask used for the fabrication of IC chips, and the repair of such mask lines.

These and other features and advantages of the invention will be apparent to those skilled in the art from the following detailed description of several preferred embodiments, taken together with the accompanying drawings, in which:

DETAILED DESCRIPTION OF PREFERRED EMBODIMENTS

Figure 1:
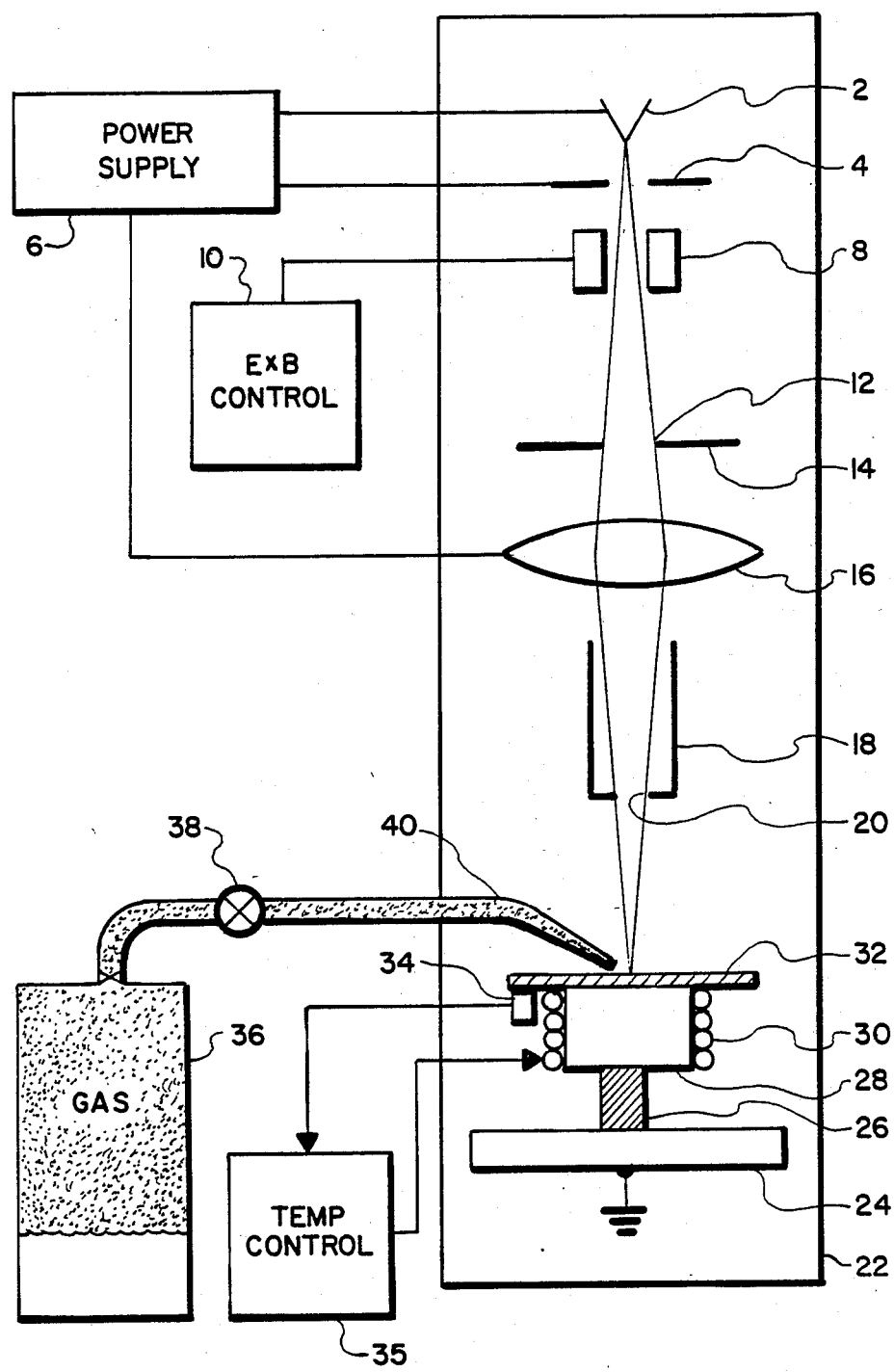
FIG. 1 is a simplified elevation view of a FIB column employing the invention.

Numerous FIB columns have been developed which are suitable for use with the present invention to deposit thin metallic lines on a substrate. One such column is disclosed in U.S. Pat. No. 4,556,798, "Focused Ion Beam Microfabrication Column", in the names of Ward et al. and assigned to Hughes Aircraft Company, the assignee of the present invention. A simplified FIB column is shown in FIG. 1. It includes a high brightness ion source 2, which is heated and has a sharp point from which ions are extracted. A metal is melted by a heater and travels by capillary action to the point of ion source 2, where it is ionized. This high brightness ion source produces a beam of charged particles that appear to emanate from a very small point.

An extraction electrode 4 is located immediately below the liquid metal ion source 2. An electric potential difference is established between ion source 2 and extraction electrode 4, sufficient to extract a beam of ions from the source, by a suitable power supply 6.

The ion beam passes through a central opening in the extraction electrode, and continues through an ExB mass separator 8. This is a known device which is used to deflect ions of undesired species out of the beam, so that only ions of the desired species continue in the beam path. It consists of a pair of electric field plates positioned on opposite sides of the beam, and a pair of magnetic pole pieces disposed orthogonal to the electric field plates. The electric and magnetic fields are controlled by a control mechanism 10, such that ions of the selected species pass through a beam defining aperture 12 in a plate 14 located immediately below the mass separator, while ions of other species are deflected out of the beam path and are blocked by plate 14.

An accelerating lens 16 is located below plate 14 to accelerate and increase the energy of the ions which pass through the beam defining aperture. Accelerating lens 16 typically consists of a pair of electrodes positioned sequentially in the beam path, with power supply 6 furnishing a potential difference between the two electrodes sufficient to provide the desired acceleration.

A beam deflector such as octupole deflector 18 is positioned below the accelerating lens, and is used to scan the beam over a substrate. The deflector includes a blanking aperture 20 that can be used to cut off the beam when desired.

As described thus far, the FIB column is conventional. It is housed within a vacuum chamber 22, and includes an x-y stage 24 that is capable of controlled movements in an x-y plane. A thermal insulator 26 extends upward from the x-y stage and supports a heating element 28 about which an electrical heating wire 30 is coiled. The substrate 32 which forms the target for the FIB is placed on top of heating element 28 and heated thereby, with a thermocouple sensor 34 sensing the substrate temperature to provide a control for the heating element. The substrate temperature as sensed by thermocouple 34 is transmitted to a temperature control mechanism 35, which controls the current flowing through heating coil 30 and thereby the substrate temperature.

The material to be deposited upon the substrate is held in a gaseous state within gas reservoir 36. A valve 38 controls the flow of source gas from the reservoir through a nozzle 40, which terminates above the substrate near the FIB and directs a flow of gas onto the portion of the substrate which is scanned by the FIB.

The present invention provides a novel method for depositing precisely defined lines of material from the gas upon the substrate 32, with a substantially lower ion dosage than previously required. In accordance with the invention, the FIB is scanned across the substrate to form a locus of nucleation sites directly on the surface by lattice damage, or by surface decomposition of an adlayer, or both. The substrate is then heated to a temperature which is high enough to support growth of the desired material from the source gas upon the nucleation sites, but below the source gas' spontaneous thermal decomposition temperature. At this temperature, the substrate is exposed to the source gas, inducing deposits of the desired material to grow upon the nucleation sites until a continuous line of deposits has been formed. Very high purity depositions with high aspect ratios have been achieved with this new process.

Figure 2:
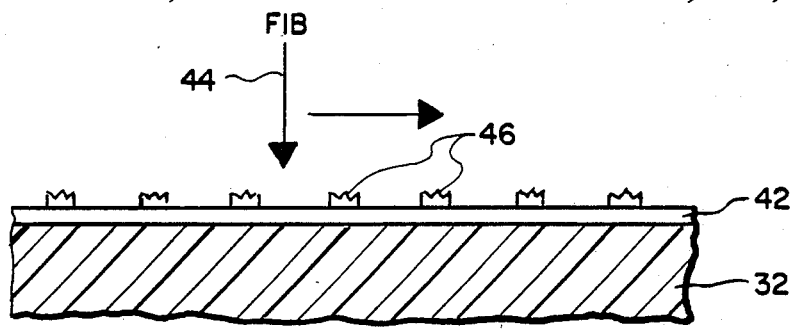
FIGS. 2 and 3 are fragmentary views of a substrate illustrating successive steps in a line deposition in accordance with the invention.
Figure 3:
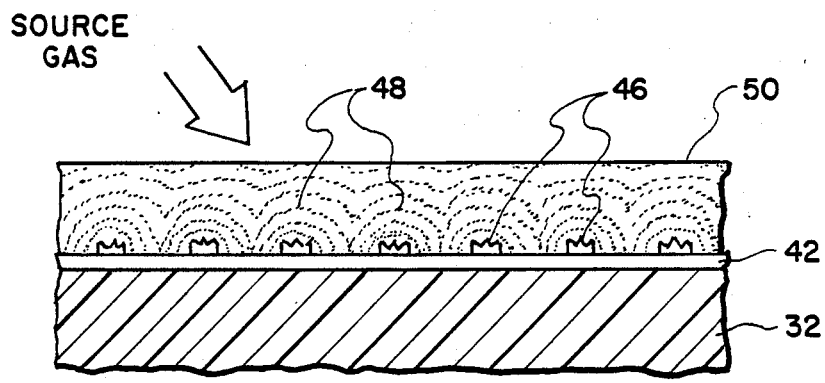

The deposition process is illustrated in FIGS. 2 and 3. An adlayer 42, consisting of a few monolayers of the ambient gas within the vacuum chamber, adheres to the surface of the substrate 32, typically a silicon chip. The adlayer is typically formed at a vapor pressure on the order of 10 mTorr. The ions then decompose the adlayer to form nucleation sites. Additionally, nucleation sites can be formed directly on the surface of the wafer by ion damage. Thus, the gas does not always have to be present during the activation phase. In the present invention the same gas may be used to both form the adlayer and provide a source for deposition material, or different gases may be used.

The FIB 44 is scanned across the surface 42 along the locus where deposition is desired. The FIB may either be scanned over the surface in a sequence of small incremental steps under computer control, or with a continuous movement. The result of this scanning is that the FIB breaks up the bonds among molecules on the surface, forming a series of nucleation sites 46 suitable for supporting growth of the deposition material. If the substrate temperature is raised high enough, spontaneous nucleation will occur over the surface even without the FIB. Accordingly, the substrate heating at this stage is kept below the spontaneous nucleation temperature at which the gas forms nucleation sites in the absence of a FIB.

The FIB may be moved in a single scan over the substrate to form a line of nucleation sites. However, for some gases more well-defined lines of deposited material have been produced, with a greater thickness:width ratio, when the FIB is moved in multiple scans over the desired locus. Better results for some gases have been obtained with multiple scanning even when the individual scans are done at a faster rate than a single scan process, and when the total dwell time of the beam on the substrate over the multiple scans is no greater than that for a single scan process.

Once sufficient nucleation sites have been formed, the FIB is turned off and the substrate is exposed to the source gas containing the material to be deposited. The gas reacts with the nucleation sites to deposit a film of material about the sites if the substrate temperature is sufficiently high. For this purpose the substrate is heated to slightly below the thermal decomposition temperature of the source gas; significantly higher temperatures will result in unwanted depositions outside of the scan line. As the exposure proceeds, the material will continue to grow, as indicated by the successive series of dashed lines 48 in FIG. 3. Eventually the gaps between nucleation sites will be filled in, producing a continuous deposit line 50.

Figure 4:
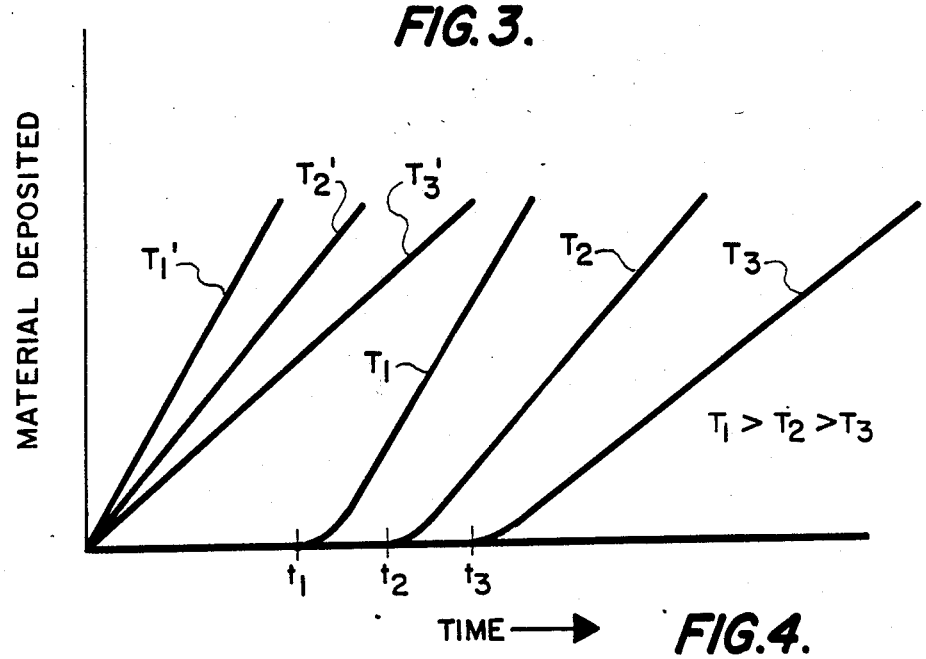
FIG. 4 is a graph showing the relationship between beam assisted and spontaneous nucleation for several temperatures as a function of heating times.

The spontaneous nucleation temperature for a particular gas is not an absolute value, but rather is dependent upon the amount of time the substrate is heated to any particular temperature and the pressure of the source gas. This phenomenon is illustrated in FIG. 4. Assume the surface is heated to three different temperatures $T_1$, $T_2$ and $T_3$, with $T_1$ greater than $T_2$ and $T_2$ greater than $T_3$, and all three temperatures are capable of supporting spontaneous nucleation for the selected gas. As illustrated in FIG. 4, there is a latency period before any spontaneous nucleation occurs. For the highest temperature $T_1$, spontaneous nucleation will commence when the substrate has been heated for a first time period $t_1$, spontaneous nucleation for the next lower temperature $T_2$ will commence at a later time $t_2$, while spontaneous nucleation for the lowest temperature $T_3$ will commence at a still later time $t_3$. Thus, the requirement that the surface be heated to a temperature below its spontaneous nucleation temperature is satisfied by controlling both the absolute temperature, and the period of time the substrate is heated and exposed to the gas.

The situation after nucleation sites have been formed with a FIB, and the substrate exposed to the source gas at the three different temperatures, is illustrated by the lines $T'_1$, $T'_2$ and $T'_3$ in FIG. 4. Growth begins almost immediately, and at the same rate for each temperature as the growth rate for the same temperature resulting from spontaneous nucleation. Thus, for example, if the substrate is heated to temperature $T_1$, it should be exposed to the source gas for a time period no longer than $t_1$ to ensure that clearly defined lines of deposit result.

Comprehensive tables relating spontaneous nucleation temperatures to heating times are not known to be available, and for any particular gas these parameters must generally be determined empirically. Differential calorimeter measurements can be used to estimate spontaneous nucleation temperatures for relatively short time periods of several seconds. For iron pentacarbonyl ($Fe(CO)_5$), exposure at 130° C. for 60 seconds produced a well defined iron line, while exposure at 150° C. for the same time period resulted in spontaneous nucleation and iron growth throughout the surface of the chip.

Either the same or different gases may be used for the adlayer gas and the source gas. If the same gas is used, it is directed over the substrate both during FIB scanning to provide the adlayer, and also afterwards to provide the source gas from which deposition takes place. In this case, the substrate temperature is kept slightly below the spontaneous nucleation temperature corresponding to the total scanning and growth time.

If different gases are used, the adlayer gas is directed over the substrate during FIB scanning, and the substrate temperature is set slightly below the spontaneous nucleation temperature for the adlayer gas corresponding to the scanning time. The adlayer gas is then purged, and the source gas directed over the substrate. The substrate is heated to a temperature slightly less than the spontaneous nucleation temperature for the source gas for the period of growth, and growth proceeds until the flow of source gas is terminated. For this purpose the spontaneous nucleation temperature and spontaneous thermal decomposition temperature may be considered to be interchangeable.

The invention has been demonstrated using iron carbonyl as both the adlayer and source gas, with a 50 keV FIB of gallium ions and a silicon substrate. The gas was delivered to the substrate by a small jet located about 1 mm above the silicon wafer, which was heated to 130° C. during exposure. The FIB both knocked off CO components from the adlayer and damaged the surface, thus forming Fe nucleation sites on the wafer surface a few angstroms in size. Both multiple and single scanning was tested. Several rapid beam scans with five second delays between each scan produced thicker line deposits of iron than a single slower scan with the same total ion dosage. The iron thickness varied with the growth time and the localized gas pressure. Typical iron depths were 0.3–0.75 microns for total growth times (including scanning) of 1–2 minutes, and localized gas pressures of several mTorr. In one successful demonstration a line about 100 microns long was deposited using ten scans of about 10 msec each.

Submicrometer-wide iron lines were formed at ion doses on the order of $10^{14}$–$10^{15}$ ions/cm$^2$, and specifically at $3 \times 10^{14}$ ions/cm$^2$. Higher ion doses produced wider and slightly deeper deposits, but at doses greater than $10^{16}$ ions/cm$^2$ (with ten scans or less) sputtering inhibited much of the metal growth in the center of the scanned region. No growth in the regions that were not scanned with the FIB were observed when the substrate temperature was maintained below the spontaneous thermal decomposition (nucleation) temperature for Fe(CO)$_5$ of about 140° C. for the two minute time period. The dosage of $3 \times 10^{14}$ ions/cm$^2$ was extremely low compared to prior FIB metal deposition techniques, being about 3 orders of magnitude less.

Ultra high deposition yields of $5 \times 10^3$–$1 \times 10^4$ iron atoms per incident gallium ion were measured using this technique. Auger analysis yielded compositional percentages of iron, carbon and oxygen of 86%, 9% and 4%, respectively, throughout the deposited layer. This was a considerably higher purity than had previously been obtained with FIB systems. No gallium was detected in the deposited lines.

The new process has been demonstrated on substrates of both silicon and SiO$_2$. However, it is believed to be applicable to virtually all kinds of reasonably clean substrates, including semiconductors, dielectrics and metals.

Aluminum deposition has also been demonstrated with this technique. In this case, an adlayer is not necessary. Simply scanning the ion beam across the surface, heating the substrate, and exposing the surface with an aluminum-bearing gas (triisobutylaluminum - TIBA) produces aluminum growth. The substrate is heated to about 330° C., slightly below the gas' spontaneous thermal decomposition temperature, and exposed to the gas for about 5-20 minutes after FIB scanning. Aluminum growth was demonstrated with a FIB dose of $3 \times 10^{16}$ ions/cm$^2$; the same dosage also produced growth when a TIBA adlayer was employed. By contrast, while iron lines can similarly be written by scanning the substrate directly with the FIB without first forming an adlayer, the omission of an adlayer when growing from Fe(CO)$_5$ increased the required ion dosage from $3 \times 10^{14}$ to $3 \times 10^{15}$ ions cm$^2$.

Although only iron pentacarbonyl and TIBA have been demonstrated thus far, the invention is applicable to other source gases from which desired deposition materials such as metals may be obtained. It is believed that the best gases will be those that have a relatively high ratio of spontaneous activation energy (SAE) to autocatalytic activation energy (ACE). The SAE is the energy required for molecules in the adlayer to break up and form nucleation sites on smooth surfaces, while the ACE is the energy required for growth to take place in the presence of existing nucleation sites. The SAE for Fe(CO)$_5$ is about 1.5 eV, while its ACE is about 0.1–0.2 eV. Ideally, the SAE:ACE ratio for the gas should be about an order of magnitude or greater. Another promising gas for low temperatures on the order of 130° C. is Ni(CO)$_5$. Promising gases for higher temperatures on the order of about 300° C. are Cr(CO)$_6$, Mo(CO)$_6$ and W(CO)$_6$. Another gas that has been identified as having good potential, although the temperature range is uncertain, is Ti(C$_5$H$_5$)$_2$.

If a gas has a high SAE:ACE ratio but the material deposited from the gas does not have optimum electrical characteristics, different gases could be used for nucleation and growth, each having properties specifically selected for its portion of the overall process. For example, Fe(CO)$_5$ has a high SAE:ACE ratio and will produce nucleation sites with a low FIB dosage, but it may be more desirable in many cases to deposit aluminum or some other metal on the substrate rather than iron. In this case, FIB scanning can take place in the presence of Fe(CO)$_5$, with growth taking place in the presence of an aluminum source gas such as TIBA. Since the spontaneous decomposition for this gas is on the order of 360° C., the substrate would preferably be heated to about 330° C. after scanning is completed and the Fe(CO)$_5$ purged. There are no theoretical limitations on the types of ions that can be used for the FIB, although heavier ions tend to produce more sputtering. However, little sputtering is expected at the low doses on the order of $10^{14}$–$10^{15}$ ions/cm$^2$ possible with this invention. Although so far only gallium ions have been demonstrated, the use of lighter ions such as silicon, beryllium, helium or hydrogen may increase the versatility of the process since these ions produce less sputtering and can be used for doping and lithography.

Ion energies no greater than about 50 keV will help to control sputtering, but energies within the general range of 1-100 keV will produce usable results. Even lower energies of a few hundred eV might work, but it is difficult to focus the beam at these low energy levels, and 1 keV is generally considered to be the minimum beam energy for a 1 micron line width.

One of the unique benefits of the present invention is that it permits the integration of metal deposition with other FIB processes such as lithography, doping implantations and the removal of material by sputtering, thereby making possible an integrated, completely mask-free IC fabrication system. This is because the low ion dosage required with the present process is compatible with the doses used in the other FIB processes, and does not unduly slow down the overall fabrication.

The system of FIG. 1 can accommodate different FIB processes by a simple selection of the ions to be used for each process, and a corresponding control over the FIB scanning for each process. For example, assume that it is desired to use silicon ions for selective n-type doping implantations, beryllium ions for selective p-type doping implantations, gold ions for sputtering, and silicon ions for metal depositions. Ion source 2 would be provided with a liquid metal source that included silicon, beryllium and gold, so that the beam extracted from the source included ions of each material. The correct ion type is selected for each process by mass separator 8 acting under the control of ExB control 10, while the other ion types are deflected out of the beam. The dosage is determined by the beam current and dwell time on the substrate; since the dosage required for depositions with the invention is on the same general order of magnitude as for the other processes, the deposition step should not take longer than the other processes. This contrasts with past FIB deposition techniques, in which the required ion dosage is so high and requires such a long period of time that it is not practical to attempt to integrate with other FIB processes in a commercial fabrication system.

Figure 5:
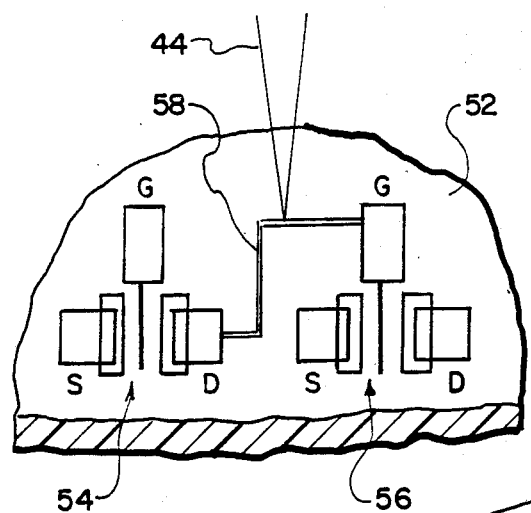
FIGS. 5–8 are plan views illustrating the application of the invention to the fabrication and repair of an IC chip, and the fabrication and repair of a photolithographic mask, respectively.

Numerous applications are available for the new deposition process, including those illustrated in FIGS. 5-8. FIG. 5 illustrates the use of the process to form electrical connections on an IC chip 52. Circuit elements such as FETs 54 and 56 are first formed on the chip by appropriate lithography and implantation steps. The FIB 44 is then scanned along a predetermined locus 58 (preferably in multiple scans) corresponding to a desired circuit connection line, to establish nucleation sites along the locus. The upper chip surface is next exposed to a source gas, and the chip is heated to a temperature slightly below the gas' spontaneous thermal decomposition temperature to establish a growth along the scan line. In the circuit shown, the conductive line deposited in conjunction with the FIB connects a pair of FETs in an invertor circuit.

Figure 6:
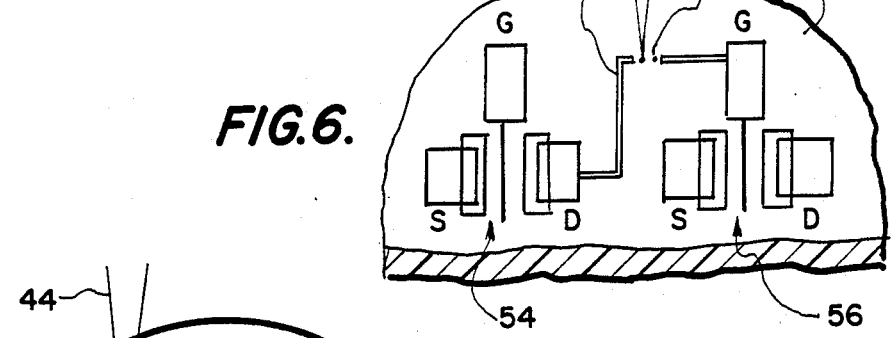

Another application, illustrated in FIG. 6, is the repair of metal interconnects on an IC chip. Assume that an opening 60 develops in the metal interconnect line 58 that was previously deposited, or that opening 60 was an original manufacturing defect. The line can be repaired by simply scanning the open area with the FIB to create new nucleation sites, and then exposing the heated chip to a source gas to deposit new material and close the opening.

Figure 7:
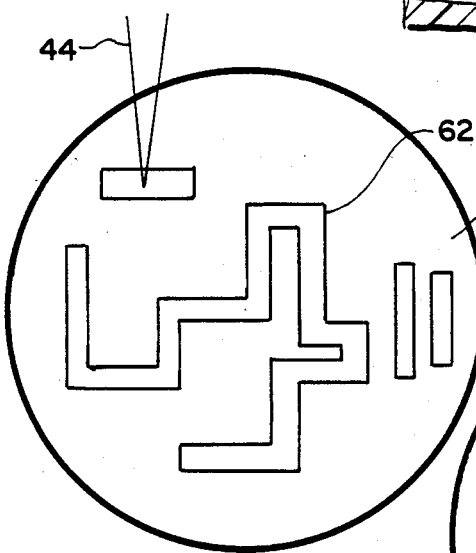

FIG. 7 illustrates the use of the invention to lay down lines on a mask used in IC chip fabrication. The FIB process is used to deposit opaque metal lines 62 on a transparent quartz substrate 64. The resulting mask is used in the fabrication of interconnect lines on a chip by shielding the chip line locations during an appropriate stage in the chip fabrication, such as when a photoresist coating is being developed. In this way lines can be etched into the photoresist corresponding to the mask line 62, enabling metal interconnections to be deposited on portions of the chip.

Figure 8:
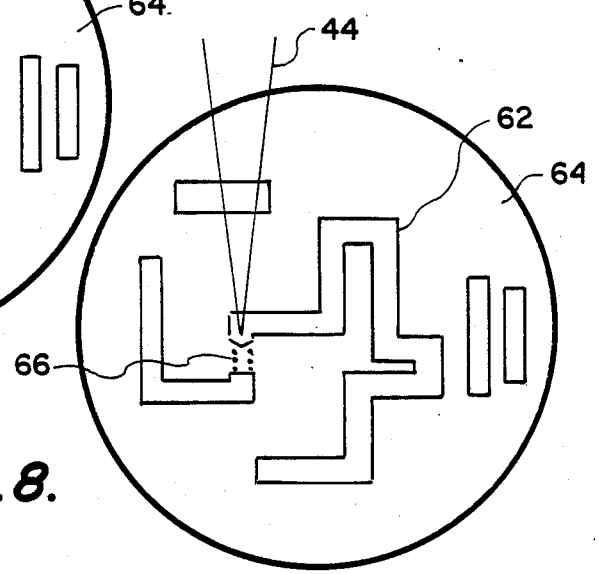

The mask can also be repaired by using the present FIB process to deposit new metal in any openings 66 that develop in the mask line 62. This repair process is illustrated in FIG. 8. The IC and mask repairs of FIGS. 6 and 8 can be integrated into quality control cycles in which any defects in the lines originally deposited are corrected as soon as manufacture of the chip or mask has been completed.

A novel chemical vapor deposition process using a FIB has thus been shown and described which has a significantly higher writing speed than prior FIB deposition techniques, requires a much lower ion dose, and produces improved line quality with a very high purity. While several variations have been described, numerous additional embodiments will occur to those skilled in the art. Accordingly, it is intended that the invention be limited only in terms of the appended claims.

We claim:

1. A method of depositing a material along a desired locus on a substrate, comprising:
   scanning the substrate along said locus with a focused ion beam (FIB) at an ion dosage on the order of about $10^{12}$–$10^{16}$ ions cm$^2$ to form nucleation sites on the substrate along said locus,
   heating the substrate, and
   exposing the heated substrate to a gas which includes said material,
   said substrate being heated to a temperature high enough for said material to grow upon said nucleation sites from said gas and form a substantially continuous deposit along said locus, but below the gas' spontaneous thermal decomposition temperature for the period of time said substrate is heated and exposed to said gas.

2. The method of claim 1, wherein the FIB scanning is terminated after an initial period of time, and the heating of the substrate and exposure of the substrate to said gas is continued after the termination of the FIB scanning.

3. The method of claim 2, wherein said substrate is exposed to multiple scans by said FIB.

4. The method of claim 1, wherein the substrate temperature during FIB scanning is less than its temperature when said material is grown.

5. The method of claim 4, wherein the substrate is at room temperature during FIB scanning.

6. The method of claim 1, wherein said material comprises a metal.

7. The method of claim 6, wherein said metal comprises aluminum and said gas comprises triisobutylaluminum.

8. The method of claim 7, wherein said substrate is heated to approximately 360° C. during said gas exposure.

9. The method of claim 6, wherein said metal comprises iron, and said gas comprises iron pentacarbonyl.

10. The method of claim 9, wherein said substrate is heated to approximately 130° C. during growth.

11. The method of claim 1, wherein the FIB ion dosage is on the order of $10^{14}$–$10^{16}$ ions/cm$^2$.

12. The method of claim 1, wherein said FIB scanning is terminated after an initial period of time, and the heating of the substrate and exposure of the substrate to said gas is continued after the termination of the FIB scanning for a total of about 5–20 min.

13. The method of claim 1, wherein the ratio of the spontaneous activation energy to the autocatalytic activation energy for said gas is at least about an order of magnitude.

14. A method of depositing a material along a desired locus on a substrate, comprising:
   exposing the substrate to a gas to form an adlayer of said gas on the substrate,
   scanning said adlayer along said locus with a focused ion beam (FIB) at an ion dosage on the order of about $10^{12}$–$10^{16}$ ions cm$^2$ to form nucleation sites in said adlayer upon the substrate along said locus,
   terminating said FIB scanning,
   heating said substrate, and
   exposing the heated substrate to a source gas which contains said material after the termination of said FIB scanning,
   said substrate being heated during source gas exposure to a temperature high enough for said material to grow upon said nucleation sites from said source gas and form a substantially continuous deposit along said locus, but below the source gas' spontaneous thermal decomposition temperature for the period of time said substrate is heated and exposed to said source gas.

15. The method of claim 14, wherein said adlayer is scanned with multiple scans along said locus by said FIB.

16. The method of claim 14, wherein said material comprises a metal.

17. The method of claim 16, wherein said metal comprises iron, and said gas comprises iron pentacarbonyl.

18. The method of claim 17, wherein said substrate is heated to approximately 130° C. during said source gas exposure.

19. The method of claim 14, wherein the FIB ion dosage is on the order of $10^{14}$–$10^{15}$ ions/cm$^2$.

20. The method of claim 14, wherein said FIB scanning is terminated after an initial period of time, and the heating of the substrate and exposure of the substrate to said source gas is continued after the termination of the FIB scanning for a total of about 1–2 min.

21. The method of claim 14, wherein the ratio of the spontaneous activation energy to the autocatalytic activation energy for said gases is at least about an order of magnitude.

22. The method of claim 14, wherein said substrate is heated to a temperature slightly below the spontaneous nucleation temperature of said gases during said scanning.

23. The method of claim 14, wherein the same type of gas is used for the adlayer gas and the source gas.

24. The method of claim 14, wherein different gases are used for the adlayer and source gases.

25. A focused ion beam (FIB) processing method, comprising:
scanning a substrate along a desired locus with a FIB, at an ion dosage on the order of about $10^{12}$–$10^{16}$ ions/cm$^2$ to form nucleation sites on the substrate along said locus,
terminating the FIB scanning,
heating the substrate,
exposing the heated substrate to a gas which includes a material to be deposited along said locus,
said substrate being heated during said gas exposure to a temperature high enough for said material to grow upon said nucleation sites from said gas and form a substantially continuous deposit along said locus, but below the gas' spontaneous thermal decomposition temperature for the period of time said substrate is heated and exposed to said gas, and
processing the substrate with at least one additional FIB process at an ion dosage on the same order of magnitude as the dosage used for scanning along said desired locus, said at least one additional FIB process comprising implantation, lithography and/or sputtering.

26. The method of claim 25, wherein said material comprises iron, and said gas comprises iron pentacarbonyl.

27. The method of claim 26, wherein said substrate is heated to approximately 130° C. during said gas exposure.

28. The method of claim 25, wherein the FIB ion dosage is on the order of $10^{14}$–$10^{16}$ ions/cm$^2$.

29. An in-situ method of forming a circuit connection during the fabrication of an IC chip, comprising:
scanning the chip along the path of the desired circuit connection with a focused ion beam (FIB) at an ion dosage on the order of about $10^{12}$–$10^{16}$ ions/cm$^2$ to form nucleation sites on the chip along said path,
heating the chip, and
exposing the heated chip to a gas which includes a conductive material,
said chip being heated during said gas exposure to a temperature high enough for said conductive material to grow upon said nucleation sites from said gas and form a substantially continuous conductive deposit along said path, but below the gas' spontaneous thermal decomposition temperature for the period of time said chip is heated and exposed to said gas.

30. The method of claim 29, wherein said conductive material comprises iron, and said gas comprises iron pentacarbonyl.

31. The method of claim 30, wherein said chip is heated to approximately 130° C. during said gas exposure.

32. The method of claim 29, wherein the FIB ion dosage is on the order of $10^{14}$–$10^{16}$ ions/cm$^2$.

33. An in-situ method of repairing a circuit connection on an IC chip, comprising:
scanning the chip along the path of the circuit connection with a focused ion beam (FIB) at an ion dosage on the order of about $10^{12}$–$10^{16}$ ions/cm$^2$ to form nucleation sites on the chip along said path,
heating the chip, and
exposing the heated chip to a gas which includes a conductive material,
said chip being heated during said gas exposure to a temperature high enough for said conductive material to grow upon said nucleation sites from said gas and form a substantially continuous conductive deposit along said path, but below the gas' spontaneous thermal decomposition temperature for the period of time said chip is heated and exposed to said gas.

34. The method of claim 33, wherein said conductive material comprises iron, and said gas comprises iron pentacarbonyl.

35. The method of claim 34, wherein said chip is heated to approximately 130° C. during said gas exposure.

36. The method of claim 33, wherein the FIB ion dosage is on the order of $10^{14}$–$10^{16}$ ions/cm$^2$.

37. An in-situ method of forming a mask for use in the fabrication of IC chips, comprising:
scanning a mask substrate along paths corresponding to desired lines on the chip with a focused ion beam (FIB) at an ion dosage on the order of about $10^{12}$–$10^{16}$ ions/cm$^2$ to form nucleation site on the mask substrate along said paths,
heating the mask substrate, and
exposing the heated mask substrate to a gas which includes an opaque material,
said mask substrate being heated during said gas exposure to a temperature high enough for said opaque material to grow upon said nucleation sites from said gas and form substantially continuous opaque deposits along said paths, but below the gas' spontaneous thermal decomposition temperature for the period of time said mask substrate is heated and exposed to said gas.

38. The method of claim 37, wherein said opaque material comprises iron, and said gas comprises iron pentacarbonyl.

39. The method of claim 38, wherein said mask substrate is heated to approximately 130° C. during exposure to said gas.

40. The method of claim 37, wherein the FIB ion dosage is on the order of $10^{14}$–$10^{16}$ ions/cm$^2$.

41. An in-situ method of repairing a line on a mask used for the fabrication of IC chip, comprising:
scanning the mask along said line with a focused ion beam (FIB) at an ion dosage on the order to about $10^{12}$–$10^{16}$ ions/cm$^2$ to form nucleation sites on the mask along said line,
heating the mask, and
exposing the heated mask to a gas which includes an opaque material,
said mask being heated during said gas exposure to a temperature high enough for said opaque material to grow upon said nucleation sites from said gas and form a substantially continuous opaque deposit along said line, but below the gas' spontaneous thermal decomposition temperature for the period of time said mask is heated and exposed to said gas.

42. The method of claim 41, wherein said opaque material comprises iron, and said gas comprises iron pentacarbonyl.

43. The method of claim 42, wherein said mask is heated to approximately 130° C. during said gas exposure.

44. The method of claim 41, wherein the FIB ion dosage is on the order of $10^{14}$–$10^{16}$ ions/cm$^2$.

* * * * *